(12) United States Patent
Amin-Shahidi

(10) Patent No.: US 8,885,149 B2
(45) Date of Patent: Nov. 11, 2014

(54) PATTERNING DEVICE SUPPORT

(75) Inventor: Darya Amin-Shahidi, Cambridge, MA (US)

(73) Assignee: ASML Holding N.V., Veldhoven (NL)

( * ) Notice: Subject to any disclaimer, the term of this patent is extended or adjusted under 35 U.S.C. 154(b) by 393 days.

(21) Appl. No.: 13/281,718

(22) Filed: Oct. 26, 2011

(65) Prior Publication Data

US 2012/0140198 A1    Jun. 7, 2012

Related U.S. Application Data

(60) Provisional application No. 61/419,191, filed on Dec. 2, 2010.

(51) Int. Cl.
*G03B 27/62* (2006.01)
*G03B 27/58* (2006.01)
*G03F 7/20* (2006.01)

(52) U.S. Cl.
CPC ...................................... *G03F 7/707* (2013.01)
USPC ................................................ 355/75; 355/72

(58) Field of Classification Search
CPC ............................. G03F 7/707; G03F 7/70783
USPC ...................................... 355/72–76; 414/217
See application file for complete search history.

(56) References Cited

U.S. PATENT DOCUMENTS

| 5,231,887 | A  | * | 8/1993  | Arvidsson et al. ................. 74/88 |
| 6,172,738 | B1 | * | 1/2001  | Korenaga et al. ............... 355/53 |
| 6,806,943 | B2 | * | 10/2004 | Barringer et al. ............... 355/75 |
| 7,153,612 | B2 | * | 12/2006 | Heerens et al. .................... 430/5 |
| 7,296,777 | B2 | * | 11/2007 | Margeson ...................... 248/550 |
| 7,667,822 | B2 | * | 2/2010  | Jacobs et al. .................... 355/75 |
| 8,253,929 | B2 | * | 8/2012  | Shibazaki ....................... 355/77 |
| 2001/0038500 | A1 |  | 11/2001 | Shibazaki |
| 2003/0081193 | A1 |  | 5/2003  | White et al. |
| 2005/0211867 | A1 |  | 9/2005  | Margeson |
| 2009/0207511 | A1 |  | 8/2009  | Schoeppach et al. |
| 2011/0001254 | A1 |  | 1/2011  | Kruijt-Stegeman et al. |

FOREIGN PATENT DOCUMENTS

| EP | 2 264 522 A2 | 12/2010 |
| JP | 2007-266187 A | 10/2007 |

* cited by examiner

*Primary Examiner* — Hung Henry Nguyen
(74) *Attorney, Agent, or Firm* — Sterne, Kessler, Goldstein & Fox P.L.L.C.

(57) ABSTRACT

In a lithographic apparatus, slippage of a patterning device is substantially eliminated during movement of a patterning device stage by providing a magnetostrictive actuator to apply an accelerating force to the patterning device to compensate for forces that would otherwise tend to cause slippage when the patterning device stage moves.

11 Claims, 11 Drawing Sheets

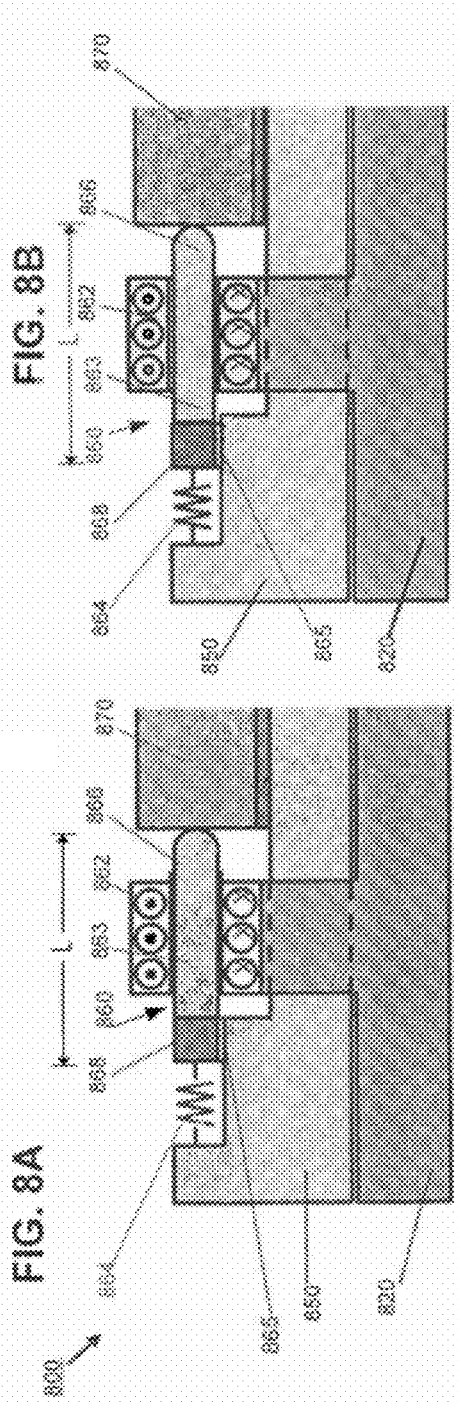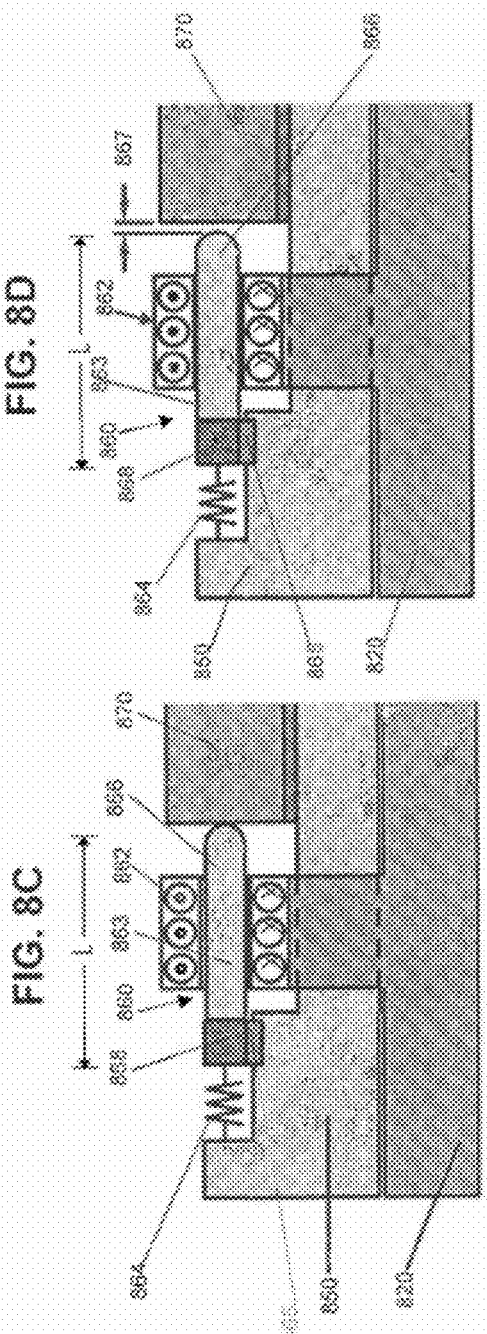

PATTERNING DEVICE SUPPORT

CROSS REFERENCE TO RELATED APPLICATIONS

This application claims benefit under 35 U.S.C. 119(e) to U.S. Provisional Application No. 61/419,191, filed Dec. 2, 2010, which is incorporated by reference herein in its entirety.

BACKGROUND

1. Field of Invention

The invention generally relates to lithography, and more particularly to support structures and arrangements for patterning devices.

2. Related Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, is typically used to generate a circuit pattern to be formed on an individual layer in an IC. This pattern is transferred onto the target portion (for example, comprising part of one, or several dies) of the substrate (for example, a silicon wafer). Typically, the pattern is transferred to a layer of radiation-sensitive material (for example, resist) provided on the substrate by imaging the pattern onto the radiation-sensitive material. A typical substrate may contain many such target portions that are adjacent to one another and are successively patterned.

Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

To increase production rate of scanned patterns, a patterning device, for example, a mask or reticle, is scanned at constant velocity, for example, 3 meters/second across a projection lens, back and forth along a scan direction. Therefore, starting from rest, the reticle quickly accelerates to reach the scan velocity, then at the end of the scan, it quickly decelerates to zero, reverses direction, and accelerates in the opposite direction to reach the scan velocity. The acceleration/deceleration rate is, for example, 15 times the acceleration of gravity. There is no inertial force on the patterning device during the constant velocity portion of the scan. However, the large inertial force encountered during the acceleration and deceleration portions of the scan, for example, approximately 60 Newtons (=0.4 kg of patterning device mass×150 m/sec2 of acceleration), can cause the patterning device to slip. Such slippage can result in a misaligned device pattern on a substrate.

Attempts to solve patterning device slippage include using a clamp, such as a vacuum system, to hold the patterning device in place and/or using a friction coating to increase friction between the patterning device and the clamp. However, ever increasing production rates demand ever faster direction reversals and, therefore, higher accelerations have reduced the benefits of these solutions. With clamps, the normal force between the patterning device and the clamp generates a friction force during the acceleration and deceleration portions of the scan. The friction force holds the patterning device in place during these portions. However, with vacuum clamps, the friction force is limited by the maximum differential pressure between atmosphere and the vacuum, which now is only about 1 bar. Further, the small surface area of patterning devices in contact with the clamps limits the normal force that can be generated by the clamps. Currently, the highest friction coefficient of suitable friction coatings is only approximately 0.25.

SUMMARY

Given the foregoing, improved methods and systems are needed that provide an anti-slip solution for patterning devices that can function under high acceleration with minimal additional mass or controls.

An embodiment of the invention provides a patterning device transport system comprising a holding system having a support device, a holding device, and magnetostrictive actuator, and a support transport device configured to move and coupled to the support device. The holding device is configured to releasably couple a patterning device to the support device, and the magnetostrictive actuator is configured to provide a force to the patterning device. The support transport device moves the support device concurrently with the magnetostrictive actuator providing the force to the patterning device such that patterning device slip during the movement of the support device is substantially eliminated.

Another embodiment of the invention provides a patterning device stage system for a lithographic apparatus, comprising a stage configured to releasably couple a patterning device to the stage, a stage control system configured to control movement of the stage, and a magnetostrictive control system configured to apply a force to the patterning device.

A further embodiment of the present invention provides a method for reducing patterning device slip during movement of a patterning device stage, comprising supporting a patterning device with a support device; concurrently holding the patterning device to the support device with a holding device; moving the support device using a first moving device; and applying a force to the patterning device using a magnetostrictive actuator concurrently with moving the support device using the first moving device.

Features and advantages of the invention, as well as the structure and operation of various embodiments of the invention, are described in detail below with reference to the accompanying drawings. The invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF DRAWINGS/FIGURES

The accompanying drawings, which are incorporated herein and form part of the specification, illustrate the present invention and, together with the description, farther serve to explain the principles of the invention and to enable a person skilled in the relevant art(s) to make and use the invention.

FIGS. 8A-8D are schematic illustrations of a partial side view of a patterning device transport system with anti-slip control at various steps of a method for loading a patterning device on a transport system according to an embodiment of the invention.

Figure 1A:
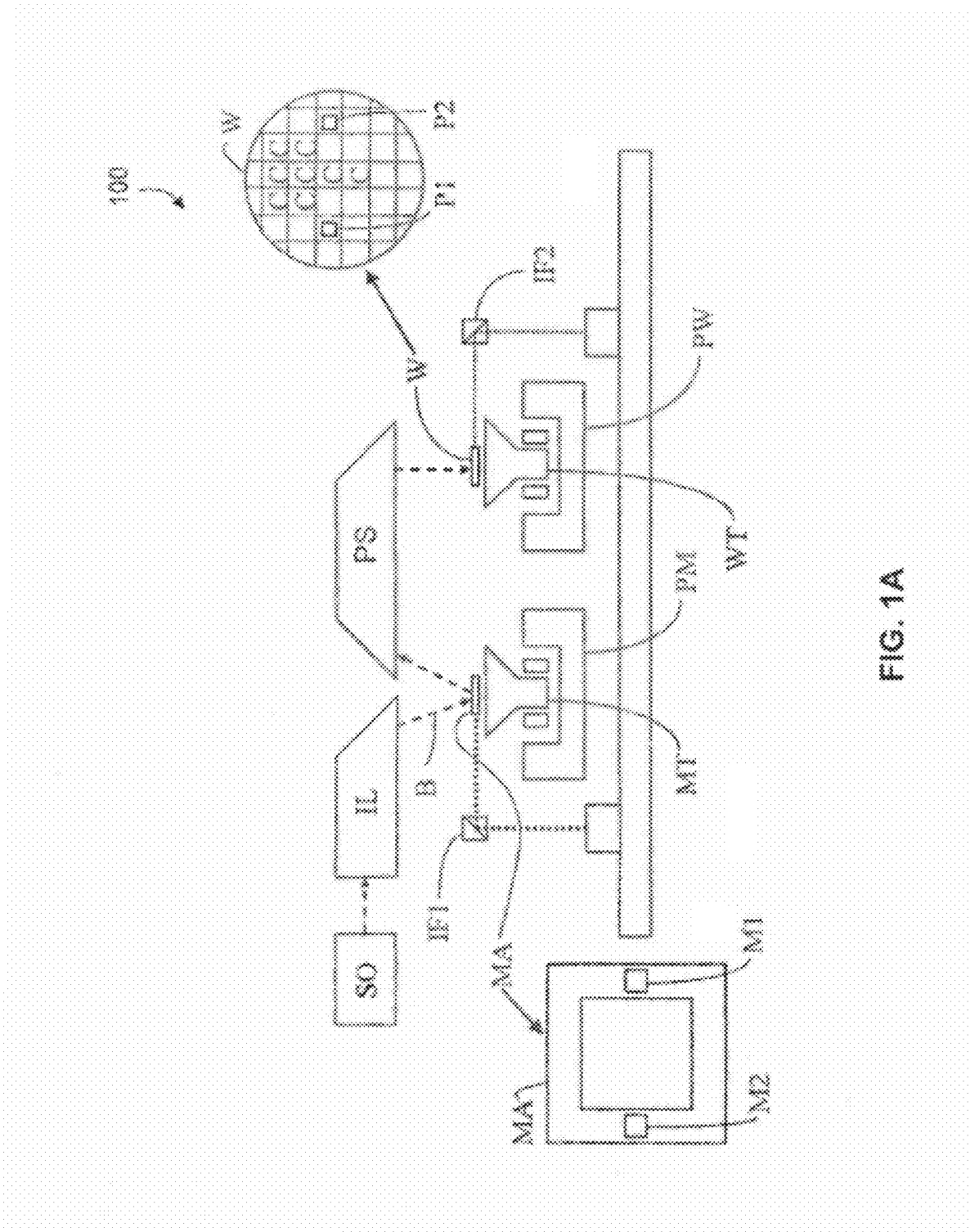
FIG. 1A is a schematic illustration of a reflective lithographic apparatus according to an embodiment of the invention.

Various features and advantages of the invention will become more apparent from the detailed description set forth below, read in conjunction with the drawings, in which like reference characters identify corresponding elements throughout. In the drawings, like reference numbers generally indicate identical, functionally similar, and/or structurally similar elements. Generally, the drawing in which an element first appears is indicated by the leftmost digit(s) in the corresponding reference number.

DETAILED DESCRIPTION

Embodiments of the invention are directed to a patterning device transport system with anti-slip control. This specification discloses one or more embodiments that incorporate the features of the present invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the present invention can also be implemented as instructions stored on a machine-readable medium, which can be read and executed by one or more processors. A machine-readable medium can include any mechanism for storing or transmitting information in a form readable by a machine (for example, a computing device). For example, a machine-readable medium can include the following: read-only memory (ROM); random access memory (RAM); magnetic disk storage media; optical storage media; and, flash memory devices. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1B:
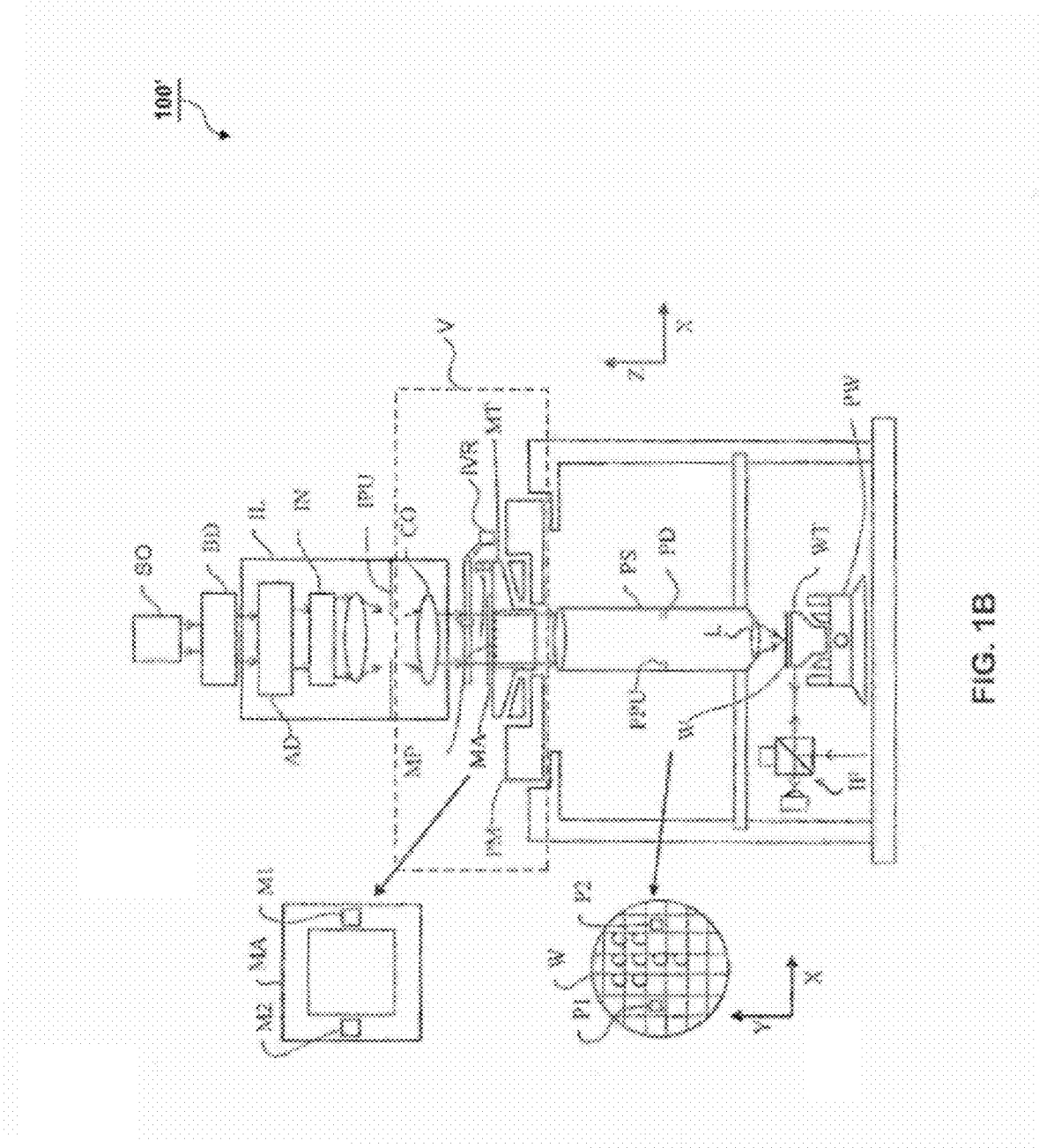
FIG. 1B is a schematic illustration of a transmissive lithographic apparatus according to an embodiment of the invention.

FIG. 1A is a schematic illustration of a reflective lithographic apparatus 100 in which embodiments of the present invention may be implemented. FIG. 1B is a schematic illustration of a transmissive lithographic apparatus 100' in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project, through a lens system L, a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system. IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses, using lens system L, the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. With the aid of the second positioner PW and position sensor IF (fix example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, Mine 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Figure 2:
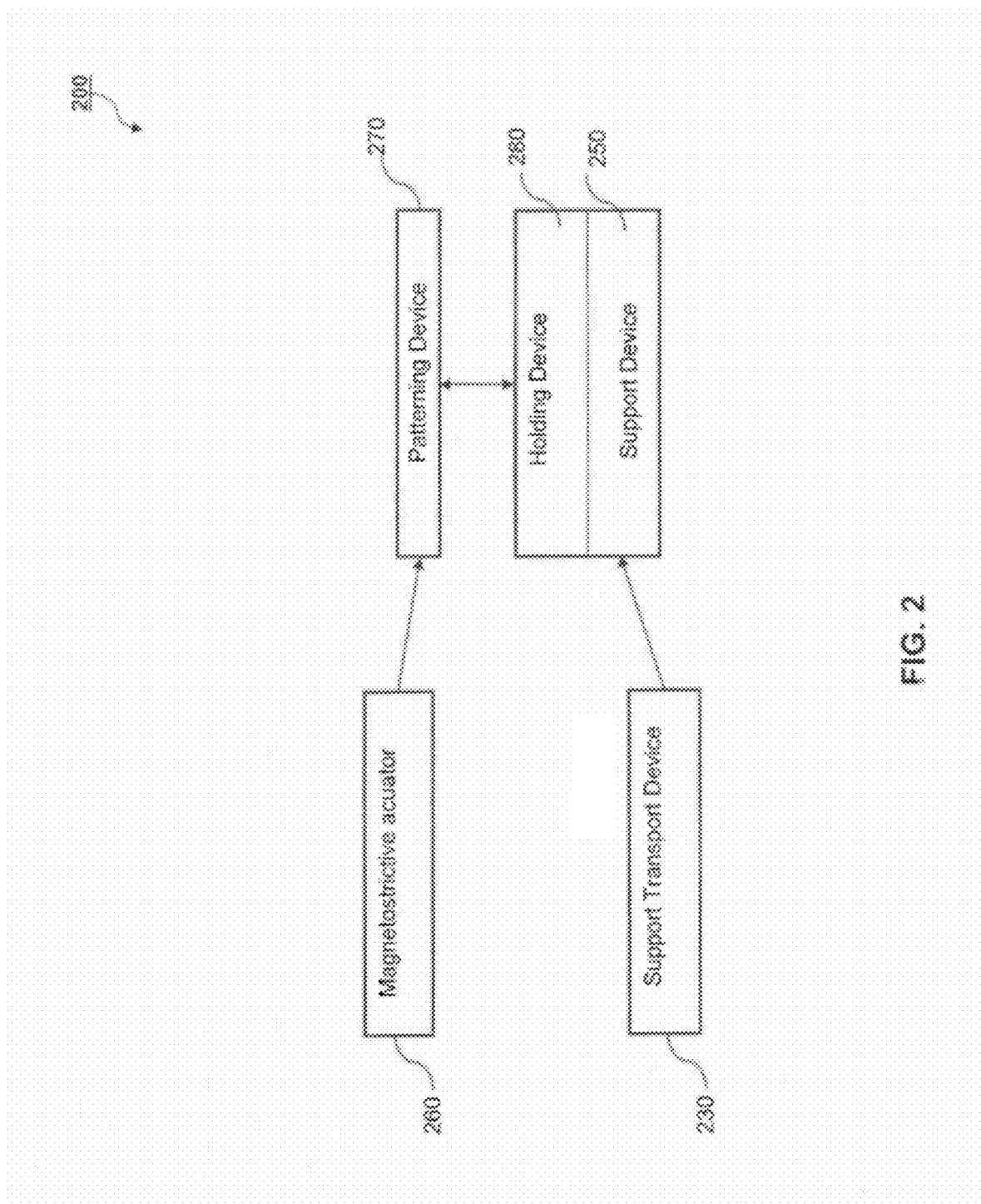
FIG. 2 is a schematic illustration of a patterning device transport system with anti-slip control, according to an embodiment of the invention.

FIG. 2 is a schematic illustration of a patterning device transport system 200, according to an embodiment of the invention. Patterning device transport system 200 includes a support transport device 230 and a holding system having a support device 250, a holding device 280, and a magnetostrictive actuator 260. Transport device 230 moves support device 250. Support device 250 supports a patterning device 270. Magnetostrictive actuator 260 applies a force to patterning device 270 during an accelerating portion of a scanning motion profile. Holding device 280 holds patterning device 270, such that during a constant velocity portion of a scanning motion profile there is no displacement of the patterning device 270 relative to support device 250.

In one example, patterning device 270 (for example, a mask, a reticle, or a dynamic patterning device) is releasably held to support device 250 by holding device 280 (for example, a vacuum system). Support device 250 can be configured to move in both an x-direction and a y-direction. Transport device 230 can be coupled to support device 250, such that transport device 230 provides sufficient force to accelerate support device 250 during an acceleration portion of a scanning motion profile.

In one example, transport device 230 may move support device 250, and the releasably held patterning device 270, at a high rate of speed and acceleration. High acceleration can generate a shearing force between patterning device 270 and support device 250. The shearing force can cause slippage of patterning device 270, relative to holding device 280 and support device 250. To substantially eliminate the shearing force, a magnetostrictive actuator 260 may be releasably coupled to patterning device 270. Magnetostrictive actuator 260 can provide a sufficient force directly on patterning device 270 to reduce the shearing force between patterning device 270 and support device 250. Given the coupling of magnetostrictive actuator 260 to patterning device 270, holding device 280 can provide a sufficient holding force, such that there is substantially no relative movement between patterning device 270 and support device 250.

In one example, the holding device 280 includes a releasable vacuum clamp system to hold patterning device 270 in a relatively stationary manner during movement. In another example, holding device 280 can use other suitable methods to hold patterning device 270, such as a high friction coating, as known to one of ordinary skill in the art. A high friction coating can also be used to increase the shear force capacity of a vacuum clamp.

Figure 3:
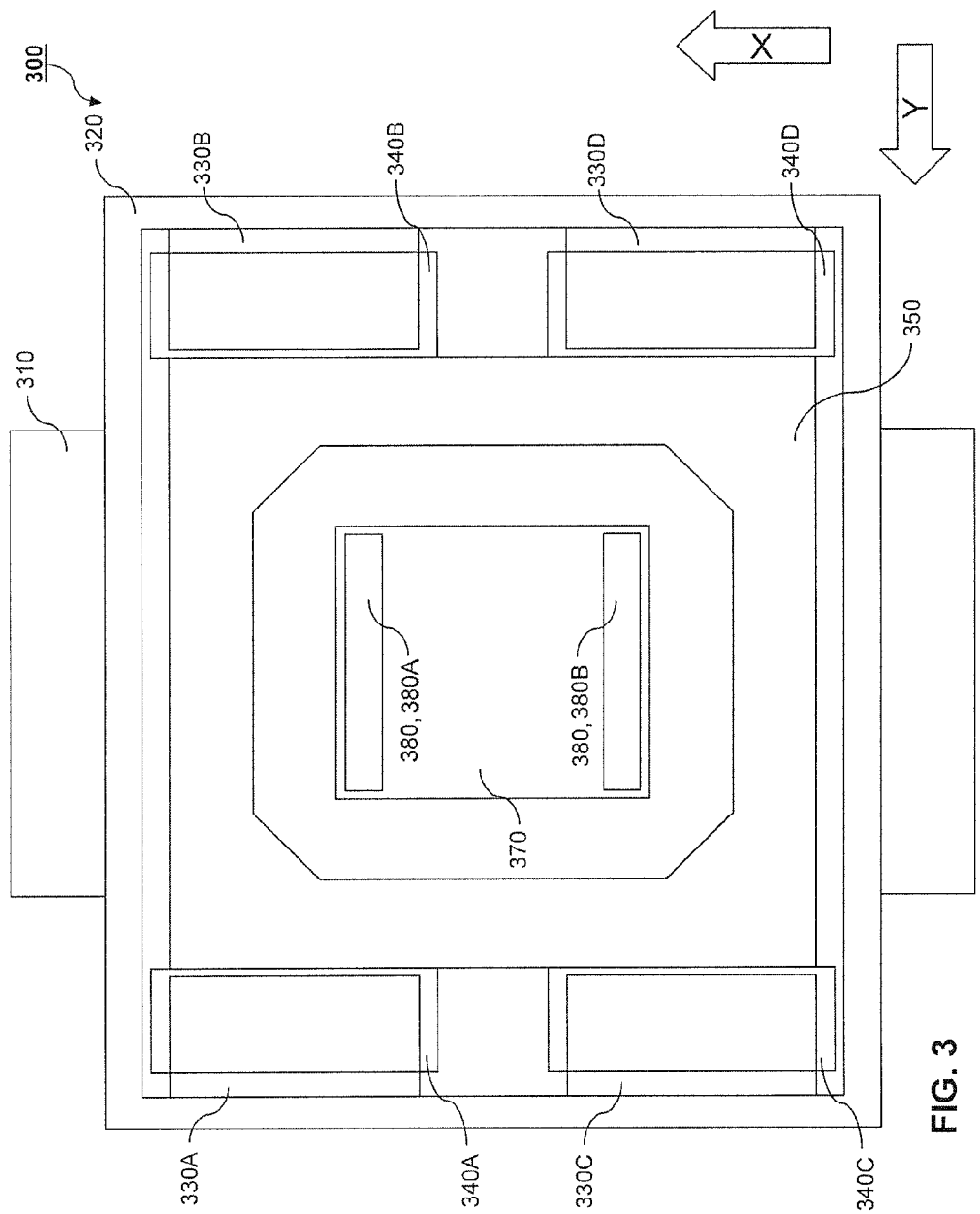
FIG. 3 is a schematic illustration of a top view of a patterning device transport system without anti-slip control according to an embodiment of the invention.

FIG. 3 is a schematic illustration of a patterning device transport system 300 without anti-slip control according to an embodiment of the invention.

In this example, patterning device transport system 300 includes a long stroke device 310, a support frame 320, a support transport device 330 (for example, coils 330A-330D and magnets 340A-340D), a support device 350, and a holding device 380 that releasably couples a patterning device 370 to the support device 350.

In an example, support device 350 can be magnetically levitated relative to support frame 320 by vertically oriented Lorentz type actuators (not shown). There can be no physical contact between support frame 320 and support device 350.

In one example, a patterning device 370 (for example, a mask, a reticle, or a dynamic patterning device) may be releasably held to support device 350 by holding device 380. In one example, holding device 380 may comprise a pair of vacuum clamps 380A and 380B that hold patterning device 370 to support device 350 through friction enhanced by a vacuum force. In one example, support device 350 can move in both the x-direction and y-direction. In one example, coils 330A-330D can provide a force in the y-direction to produce a motion of support device 350. Magnets 340A-340D electromagnetically couple coils 330A-330D without physical contact. Pairs of respective items 330-340 comprise Lorentz type electromagnetic actuators as known in the art as pure force couplings.

In one example, long stroke device 310 moves support frame 320 in the x direction (via X-oriented Lorentz actuators not shown) at a relatively slow speed that does not generate any shearing forces between patterning device 370 and support device 350.

In one example, transport device 330 moves support device 350 and releasably held patterning device 370 in the +y and −y directions accelerating at a relatively high rate to a substantial scanning speed. In one example, transport device 330 allows for high Y-forces to be exerted by support frame 320 to support device 350. In one example, transport device 330 includes coils 330A-330D and magnets 340A-330D. In one example, the coils 330A-330D are mounted to support frame 320 and magnets 340A-340D are coupled to support device 350.

For example, to move support device 350 with the releasably coupled patterning device 370, in a −y direction (for example, left to right in FIG. 3), coils 330A and 330C are energized to produce a repelling force against magnets 340A and 340C. When coils 330A and 330C are energized, the repelling force against magnets 340A and 340C propels support device 350 in the −y direction. To assist movement of support device 350 in the −y direction, coils 330B and 330D are energized, such that they substantially simultaneously produce a pulling force to magnets 340B and 340D. Therefore, coils 330A and 330C and magnets 340A and 340C push support device 350 in the −y direction, while coils 330B and 330D and magnets 340B and 340D substantially simultaneously pull support device 350 in the −y direction.

Similarly, movement of the support device 350 and patterning device 370 in the +y direction is performed in the same manner, except the forces are reversed. Device coils 330A and 330C and magnets 340A and 340C, when energized, pull support device 350 in the +y direction, while coils 330B and 330D and magnets 340B and 340D substantially simultaneously push support device 350 in the +y direction.

It is to be appreciated that the embodiment shown in FIG. 3 relies on the friction created by holding device 380 (for example, vacuum clamps and/or friction coating) between patterning device 370 and support device 350 to prevent slippage of patterning device 370 during movement.

Figure 4:
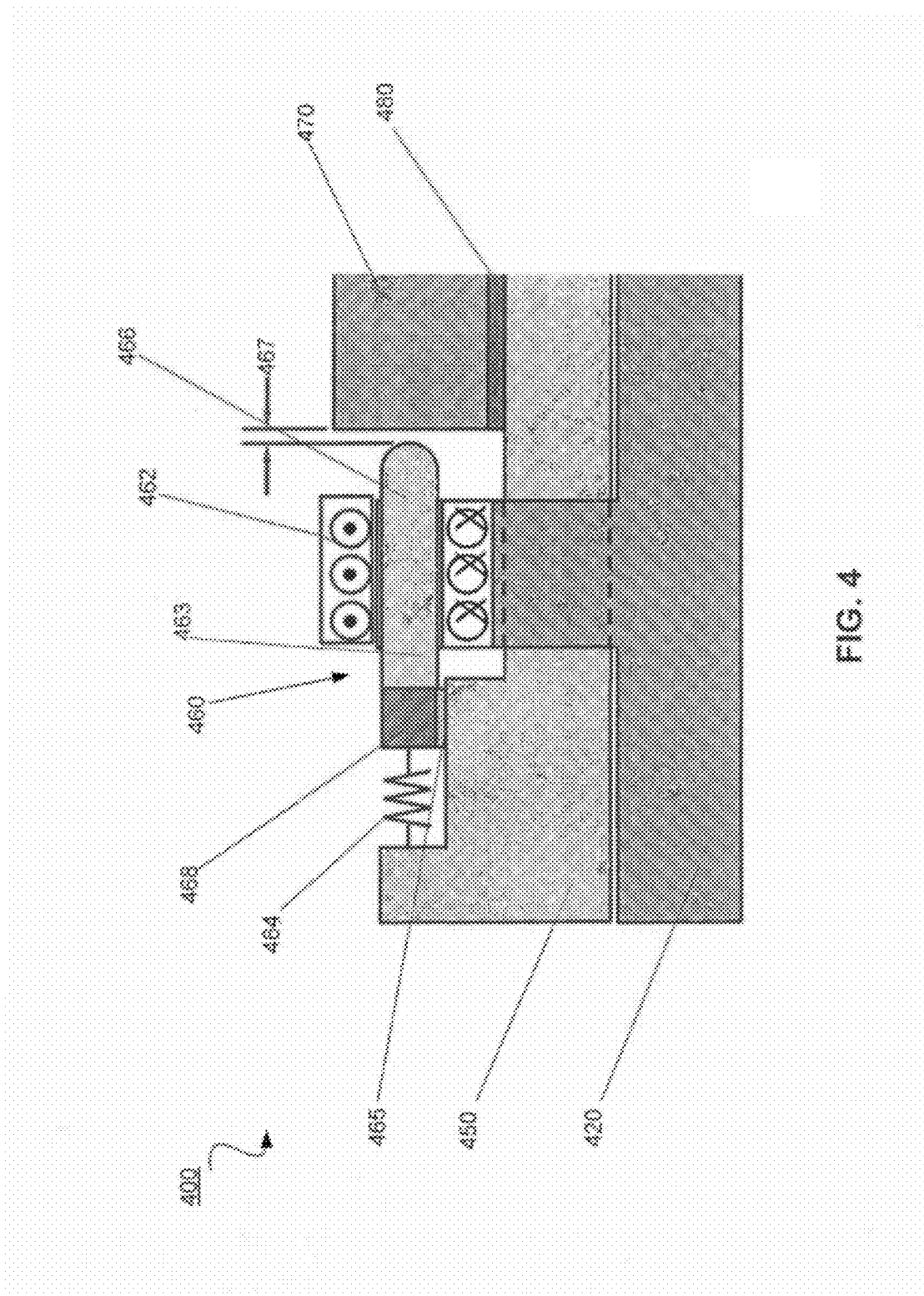
FIG. 4 is a schematic illustration of a partial side view of a patterning device transport system with anti-slip control according to an embodiment of the invention.

FIG. 4 is a schematic illustration of a patterning device transport system 400 with anti-slip control according to an embodiment of the invention.

In this example, patterning device transport system 400 includes a support frame 420 coupled to a long-stroke device (not shown), a support device 450 coupled to a support transport device (not shown), a holding device 480 that releasably couples a patterning device 470 to support device 450, and a magnetostrictive actuator 460.

In one example, patterning device transport system 400 works in a similar manner to patterning device transport system 300, but with the addition of magnetostrictive actuator 460. Movement in the x direction is accomplished as in FIG. 3 through the use of a long stroke device (not shown), which moves support frame 420 on which support device 450 is coupled. Movement in the y direction is accomplished as in FIG. 3 through the use of a coupled support transport device (not shown). In one example, to move in the −y direction, the support transport device, for example, electromagnetically coupled coils and magnets, are energized to move support device 450 in the −y direction, while movement of the support device 450 and patterning device 470 in the +y direction is done in the same manner, except that the forces are reversed.

In another example, magnetostrictive actuator 460 is used in patterning device transport system 400 to supplement the frictional force created by holding device 480 (for example, vacuum clamps or friction coating) with a normal push force applied directly to patterning device 470 at the edge opposite to the direction of acceleration to substantially reduce or eliminate patterning device slip. In one example, magnetostrictive actuator 460 can include a magnetic field source 462, a push rod 463, a biasing device 464, and a clamping device 465. Magnetostrictive actuator 460 can further include additional magnetic field sources, push rods, biasing devices, and clamping devices on either the same side or the opposite side of patterning device 470, which operate in substantially the same manner.

In one example, push rod 463 comprises a magnetostrictive material that changes its shape or dimensions under a magnetic field. The push rod 463 can be electromagnetically coupled with magnetic field source 462. When magnetic field source 462 creates a magnetic field, push rod 463 changes dimensions and releasably couples with patterning device 470.

In one example, magnetic field source 462 is a coil, and push rod 463 passes through the coil. When the coil is energized, the resulting magnetic field increases the length of push rod 462 such that a distal end 466 of the push rod 463 contacts the patterning device 470. The contact between distal end 466 of push rod 463 and patterning device 470 produces a force directly on patterning device 470. The magnetostrictive material can be any suitable material that change dimensions under a magnetic field. The push rod's magnetostrictive material and dimensions, as well as the coil's turns per unit length of the push rod and current, can be modified or adjusted to achieve the desired change in length of the push rod 463. Further, because the change in length of the push rod 463 caused by the magnetic field is substantially linear and repeatable, additional position and force sensors to control the push rod 463 in closed-loop operation are not necessary. Instead, the repeatable response of push rod 463 may be used during open-loop operation. Such sensors, however, may be used to calibrate the patterning device transport system 400 before manufacturing any ICs or other devices and/or structures.

In one example, the magnetostrictive material is Terfenol-D, and the push rod 463 is approximately 0.75 cm in diameter, and approximately 5 cm in length. In this example, the coil has approximately 500 turns over the length of the rod 463 and is driven by approximately a 1 A current. This example is provided merely to exemplify the invention, and the invention is not limited to these specific examples of rod material, rod dimensions, coil turns, and coil current.

In another example, the magnetostrictive actuator includes a biasing device 464 biases the push rod 463 towards the patterning device 470. Although the biasing device 464 is illustrated as a spring in FIG. 4, the biasing device 464 is not limited to springs. The biasing device 464 can be a spring, a pneumatic actuator, a hi-stable actuator, or any other suitable device for applying a biasing force to the push rod 463. The biasing device 464 can apply a preload to set the initial gap 467 between the distal end 466 of the push rod 463 and the patterning device 470 as discussed below with reference to FIGS. 7 and 8A-8D. The biasing device 464 can also allow the push rod 463 to retract away from the patterning device 470 during patterning device exchanges. In another example, biasing device 464 can be configured also to retract push rod 463 away from patterning device 470.

In one example, the magnetostrictive actuator 460 can also include a clamping device 465. Clamping device 465 is configured to releasably couple a proximal portion 468 of push rod 463 to support device 450. When coupled, clamping device 465 prevents the proximal portion 468 from moving relative to the patterning device 470. Clamping device 465 can, for example, include a vacuum system or any other suitable device for releasably coupling a portion of the push rod 463.

In one example, a common control signal controls the transport device coupled to the support device 450 and the magnetostrictive actuator 460. For example, the current used to drive the transport device, for example, electromagnetically coupled coils and magnets, can be used to control the magnetic field source 462. Thus, the transport device moves the support device 450 substantially simultaneously with energizing the coil of the magnetic field source 462 to create a magnetic field. Also substantially simultaneously, the magnetic field causes the length of the push rod 463 to increase and contact patterning device 470. This operation produces a force on both the patterning device 470 to supplement the friction force created by holding device 480. In another example, the current that drives the long-stroke device coupled to support frame 420 can be used to control the magnetic field source 462. Accordingly, the coil of magnetic field source 462 is energized and the length of push rod 463 is increased simultaneously with moving support frame 420 with the long-stoke device. These configurations eliminate the need for additional control signal processing devices, for example, signal amplifiers, for the signal that controls magnetostrictive actuator 460.

In another example, however, the signal that controls the magnetostrictive actuator 460 is separate from the signal that controls the transport device or long-stroke device. In this example, additional control signal processing devices, for example, a signal amplifier, may be necessary for the magnetostrictive actuator 460.

Figure 5:
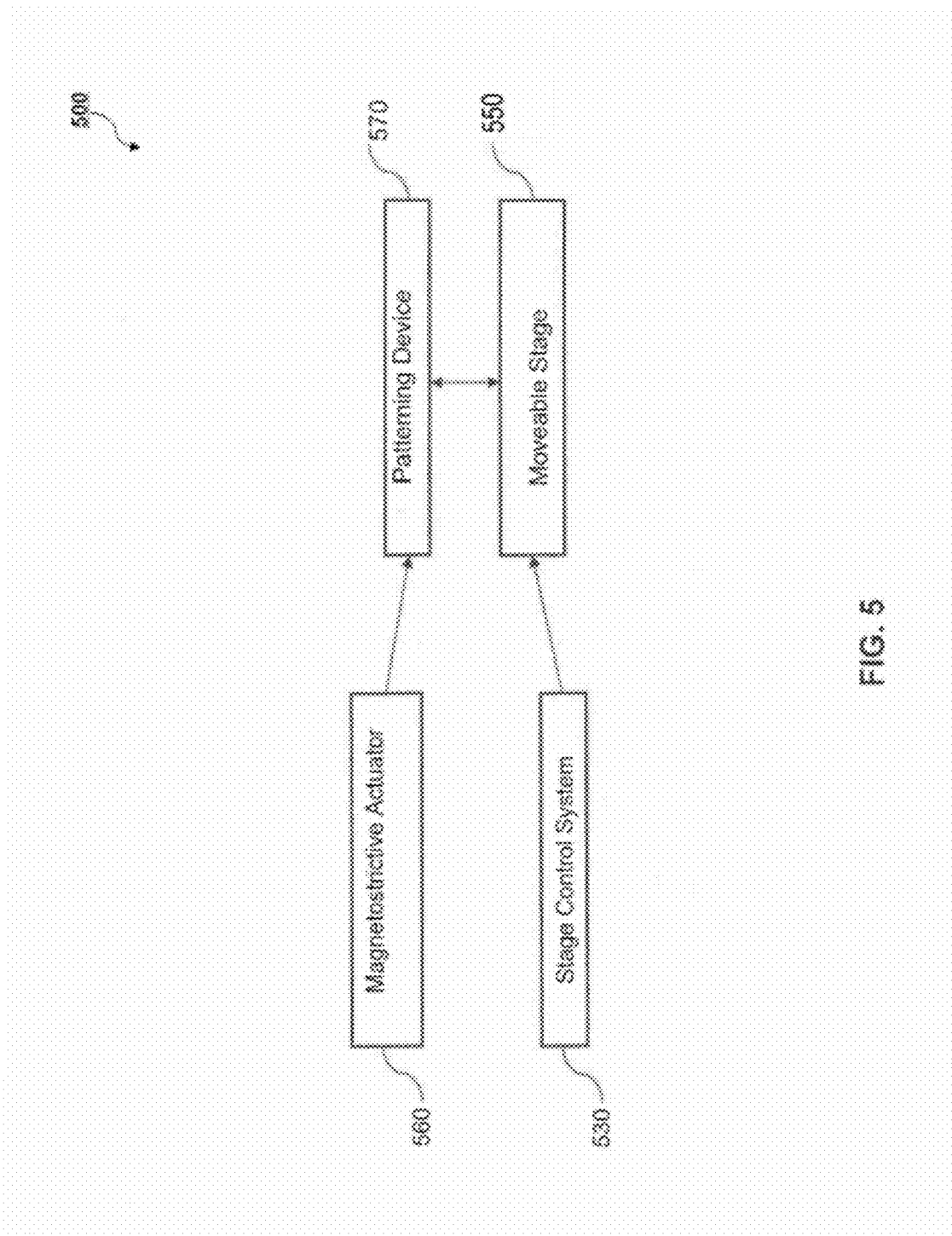
FIG. 5 is a schematic illustration of a stage system with anti-slip control according to an embodiment of the invention.

FIG. 5 is a schematic illustration of a stage system 500 for a lithographic apparatus according to an embodiment of the invention. Stage system 500 includes stage control system 530, a stage 550 which is movable, and a magnetostrictive actuator 560.

In one example, a patterning device 570 is releasably held to stage 550 (for example, using a vacuum). Stage control system 530 is coupled to stage 550. Stage control system 530 can provide sufficient force to allow movement of stage 550. Stage control system 530 can move stage 550, and the releasably held patterning device 570, at a high rate of speed with a corresponding high rate of acceleration. Such acceleration can generate a shearing force between patterning device 570 and stage 550, such that patterning device 570 can slip relative to stage 550. To substantially eliminate the shearing force, a magnetostrictive actuator 560 is releasably coupled to patterning device 570. Magnetostrictive actuator 560 can provide a force directly to patterning device 570 to reduce the shearing force between patterning device 570 and stage 550. The force between patterning device 570 and stage 550 is such that, given the coupling of magnetostrictive actuator 560 to patterning device 570, there is sufficient holding force such that there is substantially no relative movement between patterning device 570 and stage 550.

In another embodiment stage 550 can use other methods to hold patterning device 570, such as a friction coating or other methods as known to one of ordinary skill in the art.

Figure 6:
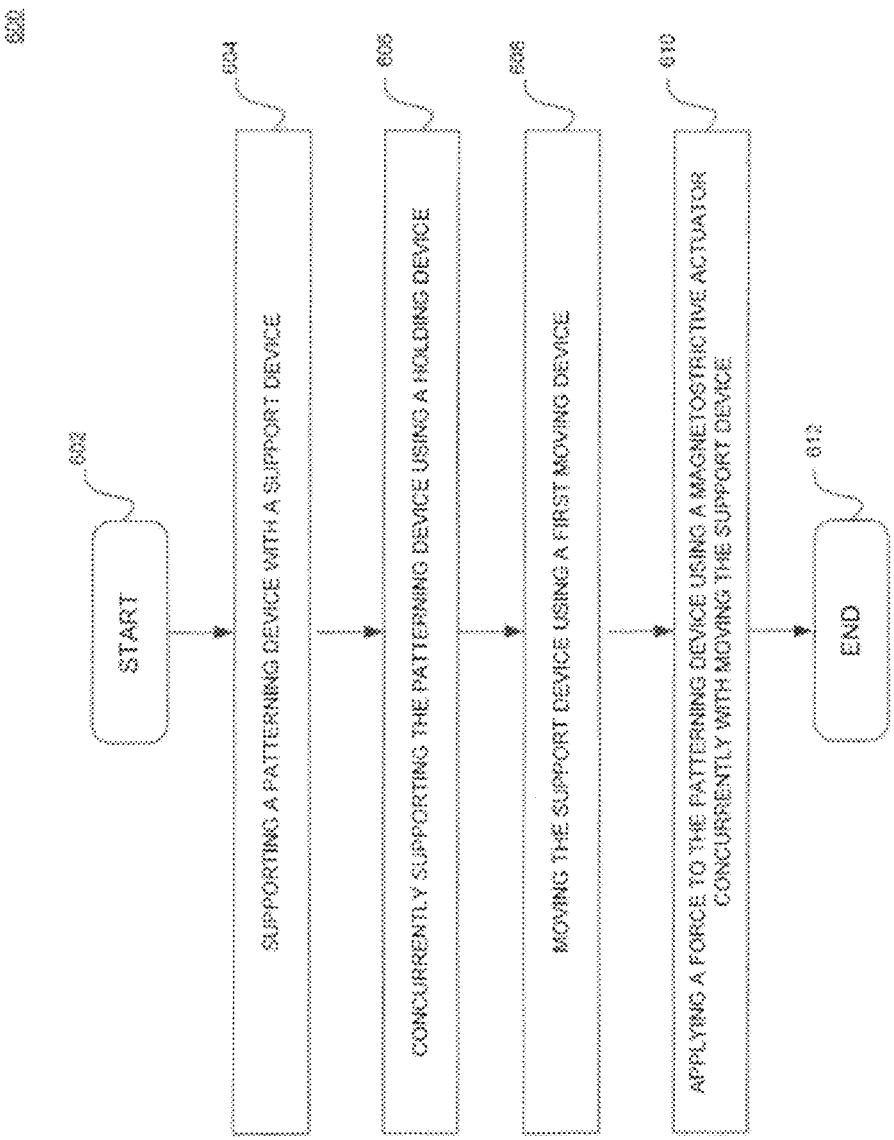
FIG. 6 is a flowchart illustrating a method for patterning device transport with anti-slip control according to an embodiment of the invention.

FIG. 6 is an illustration of a flowchart depicting a method 600 for moving a patterning device according to an embodiment of the present invention. For example, method 600 may be performed using one or more of the above devices depicted in FIGS. 1A, 1B, and 2-5. In this example, method 600 starts at step 602, and proceeds to step 604. In step 604, a patterning device is supported with a support device. In step 606, the patterning device is concurrently supported using a holding device, for example, a vacuum system. In step 608, the support device is moved using a first moving device. In step 610, a force is applied to the patterning device using a magnetostrictive actuator concurrently with moving the support device. The method then ends at step 612.

Figure 7:
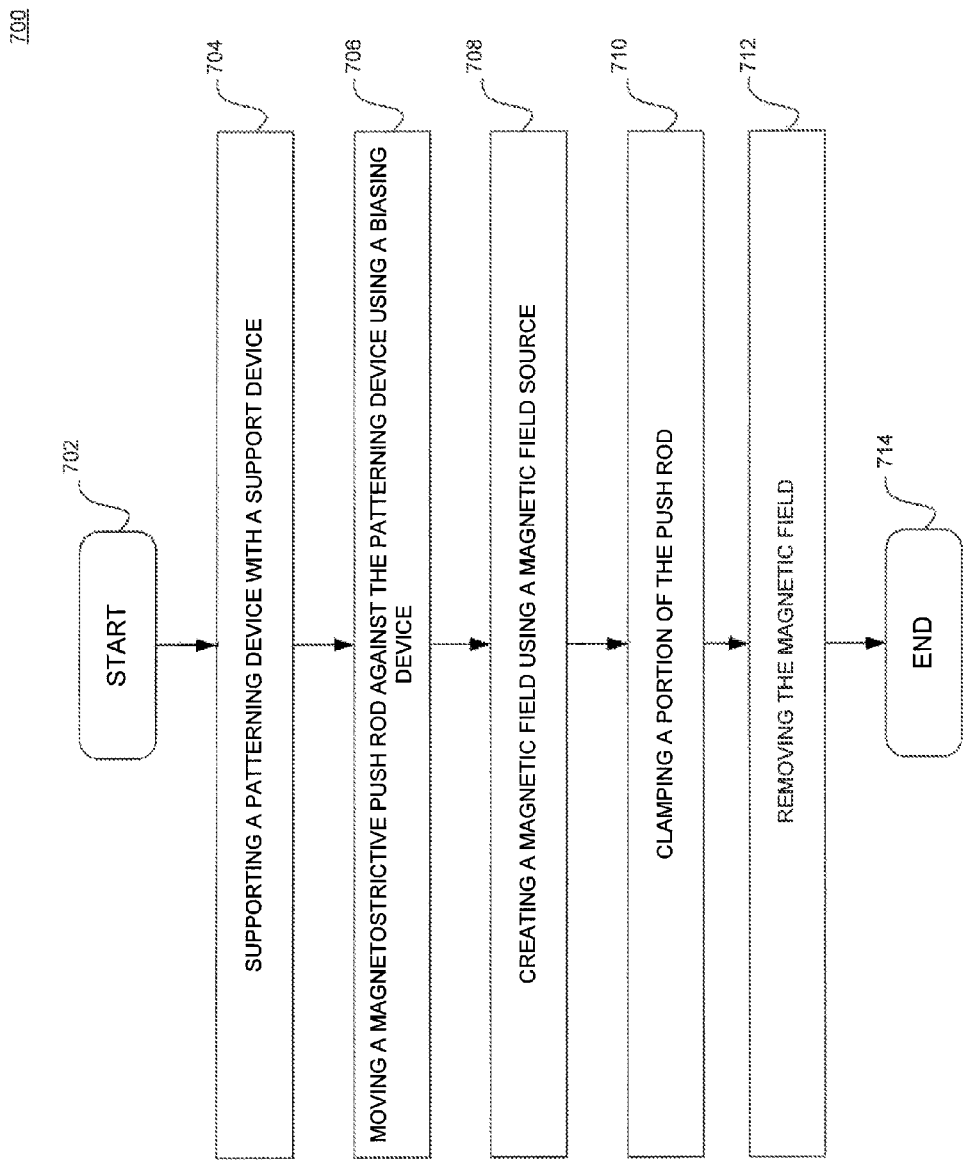
FIG. 7 is a flow chart illustrating a method for loading a patterning device on a transport system with anti-slip control according to an embodiment of the invention.

FIG. 7 is an illustration of a flowchart depicting a method 700 for loading a patterning device on a patterning device transport system according to an embodiment of the present invention. The change in length of a magnetostrictive push rod under a magnetic field can be limited to tens of micrometers. Thus, the distal end of the push rod must be located in close proximity to the patterning device when not exposed to a magnetic field and in its non-extended state. Additionally, the push rod cannot be in constant contact with the patterning device during the scan interval because thermal expansion of the push rod can disturb the positioning of the patterning device. Thus, it is desirable to load a patterning device on a patterning device transport system according to method 700 to automatically create an initial gap between the distal end of the push rod and the patterning device.

In this example, method 700 starts at step 702, and proceeds to step 704. In step 704, a patterning device is supported with a support device. In step 706, a biasing device moves a magnetostrictive push rod against the patterning device on the support device. In step 708, a magnetic field is created using a magnetic field source. In one example, the magnetic field is proportional to the desired no-field clearance or gap between the push rod and the patterning device. The magnetostrictive push rod, which is electromagnetically coupled with the magnetic field source, increases in length. Steps 706 and 708 are interchangeable and may be performed concurrently. In step 710, a proximal portion of the magnetostrictive push rod is releasably coupled to the support device using a clamping device, for example a vacuum system. In step 712, the magnetic field is removed, and the magnetostrictive push rod returns to its original length, creating a gap between the distal end of the push rod and the patterning device. The process ends at 714.

FIGS. 8A-8D are schematic illustrations of a patterning device transport system 800 with anti-slip control at different steps of method 700 for loading a patterning device 870 on a patterning device transport system 800 including a support frame 820. In each of these figures, a magnetorestrictive actuator 860 is biased by a biasing device 864, pictured as a spring.

In FIG. 8A, while the coil of magnetic field source 862 is de-energized and not forcing magnetostrictive actuator 860, the patterning device 870 is placed on support device 850 (step 704). Biasing device 866 moves magnetostrictive push rod 863 towards patterning device 870 such that the distal end 866 of push rod 863 contacts patterning device 870 (step 706). This contact creates a preload force against patterning device 870. In FIG. 8B, the coil of magnetic field source 862 is energized to create a magnetic field (step 708). The length L of magnetostrictive push rod 863, which is electromagnetically coupled to magnetic field source 862, is increased.

In FIG. 8C, a proximal portion 868 is releasably coupled to the support device 850 using a clamping device 865, for example, a vacuum system (step 710). When clamped, the proximal portion 868 is fixed relative to the patterning device 870. In FIG. 8D, the coil of magnetic field source 862 is de-energized to remove the magnetic field. When the magnetic field is removed, the length L of magnetostrictive push rod 863 returns to its original length, as in step 704. The decrease in length L creates a gap 867 between the distal end 866 of the push rod 863 and the patterning device 870. In one example, gap 867 is approximately 2 micrometers.

In one example, method 800 is performed before for moving a patterning device 870 according to method 700.

Figure 9:
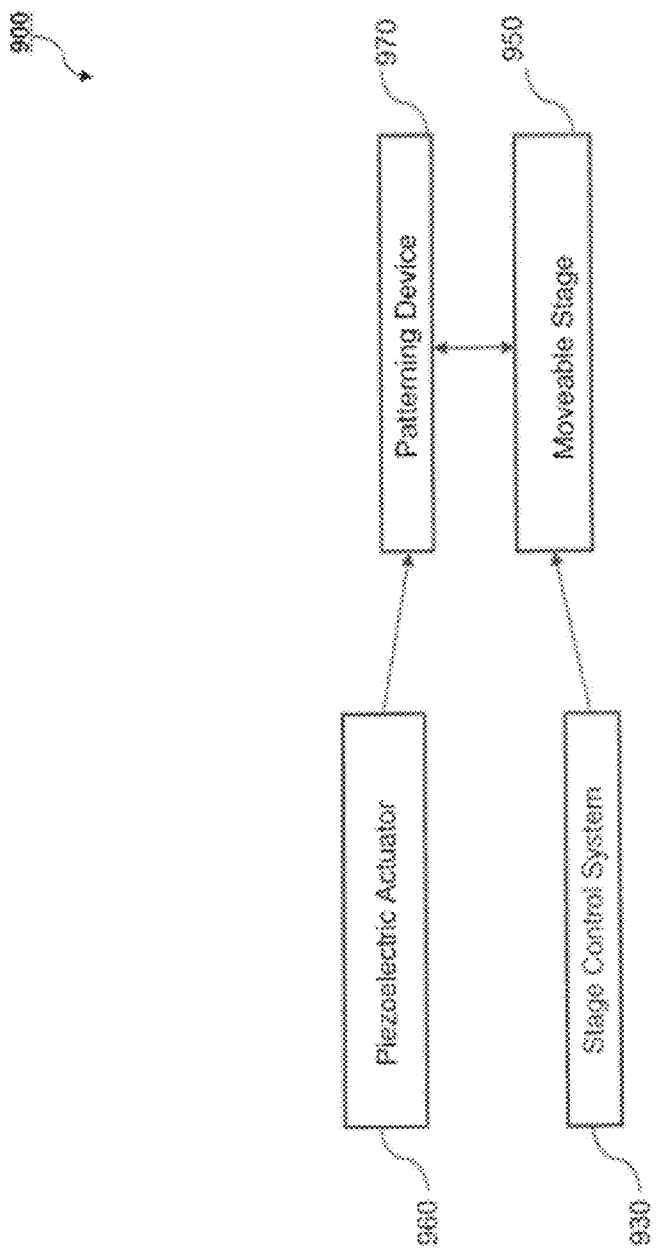
FIG. 9 is a schematic illustration of a stage system with anti-slip control according to an embodiment of the invention.

FIG. 9 is a schematic illustration of a stage system 900 with anti-slip control according to an embodiment of the invention. In this embodiment, the system includes a piezoelectric actuator 960, instead of a magnetostrictive actuator as shown in prior embodiments. The system 900 can be configured in a similar fashion to the systems discussed above, and can be operated to reduce slippage of patterning device 970 during movement of a movable stage 950 controlled by a stage control system 930 in a similar manner as described above. For example, a voltage excitation can be used to create or manipulate an electric field, which changes the dimensions of a piezoelectric element of piezoelectric actuator 960.

Figure 10:
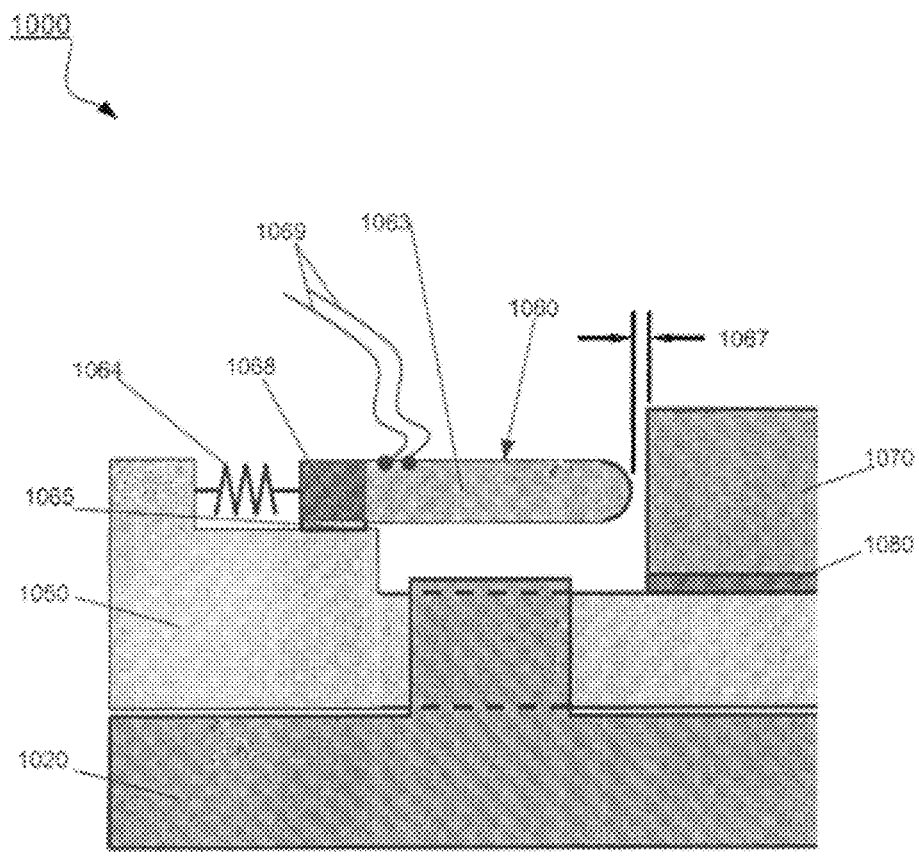
FIG. 10 is a schematic illustration of a partial side view of a patterning device transport system with anti-slip control according to an embodiment of the invention.

FIG. 10 is a schematic illustration of a partial side view of a patterning device transport system 1000 with anti-slip control according to an embodiment of the invention.

In this example, patterning device transport system 1000 includes a support frame 1020 coupled to a long-stroke device (not shown), a support device 1050 coupled to a support transport device (not shown), a holding device 1080 that releasably couples a patterning device 1070 to support device 1050, and a piezoelectric actuator 1060.

In one example, patterning device transport system 1000 works in a similar manner to the patterning device transport systems 400, but with a piezoelectric actuator 1060 instead of a magnetostrictive actuator. Movement in the x direction is accomplished as in FIG. 4 through the use of a long stroke device (not shown), which moves support frame 1020 on which support device 1050 is coupled. Movement in the y direction is accomplished as in FIG. 4 through the use of a coupled support transport device (not shown). In one example, to move in the −y direction, the support transport device, for example, electromagnetically coupled coils and magnets, are energized to move support device 1050 in the −y direction, while movement of the support device 1050 and patterning device 1070 in the +y direction is done in the same manner, except that the forces are reversed.

In another example, piezoelectric actuator 1060 is used in patterning device transport system 1000 to supplement the frictional force created by holding device 1080 (for example, vacuum clamps or friction coating) with a normal push force applied directly to patterning device 1070 at the edge opposite to the direction of acceleration to substantially reduce or eliminate patterning device slippage.

In one example, piezoelectric actuator 1060 can include a piezoelectric element 1063, a biasing device 1064, and a clamping device 1065 configured to releasably couple a proximal portion 1068 of piezoelectric element 1063 to support device 1050. Piezoelectric actuator 1060 can further include additional piezoelectric elements, biasing devices, and clamping devices on either the same side or the opposite side of patterning device 1070, which operate in substantially the same manner.

In one example, piezoelectric element 1063 changes its dimensions under an electric field. The piezoelectric element 1063 can be electrically coupled to a voltage source via power terminals 1069. When a voltage or charge is applied to piezoelectric element 1063, the internal electric field of the piezoelectric element 1063 changes, which causes the piezoelectric element 1063 to change dimensions and releasably couple with patterning device 1070. In one example, the resulting electric field increases the length of piezoelectric element 1062 such that a distal end of the piezoelectric element 1062 contacts the patterning device 1070. The contact between the distal end of piezoelectric element 1062 and patterning device 1070 produces a force directly on patterning device 1070. Piezoelectric actuator 1060 may be any suitable device that changes dimensions under an electric field, for example, piezoelectric stacks and tubes.

In another example, method 600 for moving a patterning device, as described above, may be performed using patterning device transport system 1000. In this example, at step 610, a force is applied to the patterning device using the piezoelectric actuator 1060 concurrently with moving the support device.

Further, method 700 for loading a patterning device, as described above, may be performed using patterning device transport system 1000. In this example, at step 706, a biasing device moves a piezoelectric element against the patterning device on the support device. In step 708, an electric field is created by applying a voltage or charge to the piezoelectric element, which increases the length of the piezoelectric element. In step 710, a proximal portion of the piezoelectric element is releasably coupled to the support device using a clamping device. In step 712, the electric field is removed, and the piezoelectric element returns to its original length, creating a gap 1067 between the distal end of the piezoelectric element and the patterning device.

CONCLUSION

It is intended that the Detailed Description portion of this patent document, and not the Summary and Abstract sections, be used to interpret the claims. The Summary and Abstract portions may set forth one or more but not all exemplary embodiments of the present invention as contemplated by the inventor(s), and thus, are not intended to limit the present invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A patterning device transport system, comprising:
 a holding system having,
  a support device,
  a holding device configured to releasably couple a patterning device to the support device, and
  a magnetostrictive actuator comprising a magnetic field source and a push rod including a magnetostrictive material, wherein the push rod is configured to provide a force to the patterning device, and wherein the magnetic field source creates a magnetic field that increases a length of the push rod in a direction substantially in a plane of the patterning device; and
a support transport device configured and arranged to move the support device concurrently with the magnetostrictive actuator providing the force to the patterning device so as to substantially eliminate patterning device slip during the movement of the support device.

2. The system of claim 1, wherein the magnetic field source comprises a coil.

3. The system of claim 1, wherein the magnetostrictive material is Terfenol-D.

4. The system of claim 1, wherein the magnetostrictive actuator further comprises another magnetic field source and another push rod comprising the magnetostrictive material, and wherein the another magnetic field source creates a magnetic field that increases a length of the another push rod.

5. A patterning device transport system, comprising:
a holding system having,
a support device,
a holding device configured to releasably couple a patterning device to the support device, and
a magnetostrictive actuator configured to provide a force to the patterning device and comprising a magnetic field source, a push rod including a magnetostrictive material, a biasing device configured to bias the first push rod towards the patterning device, and a clamping device configured to releasably couple a portion of the push rod to the support device, wherein the magnetic field source creates a magnetic field that increases a length of the push rod; and
a support transport device configured and arranged to move the support device concurrently with the magnetostrictive actuator providing the force to the patterning device so as to substantially eliminate patterning device slip during the movement of the support device.

6. The system of claim 5, wherein the biasing device is further configured to retract the first push rod away from the patterning device.

7. The system of claim 1, wherein the holding device comprises a vacuum system to releasably couple the patterning device to the support device.

8. A patterning device transport system, comprising:
a holding system having,
a support device,
a holding device configured to releasably couple a patterning device to the support device, and
a magnetostrictive actuator configured to provide a force to the patterning device; and
a support transport device configured and arranged to move the support device concurrently with the magnetostrictive actuator providing the force to the patterning device so as to substantially eliminate patterning device slip during the movement of the support device,
wherein a common control signal controls the magnetostrictive actuator and the support transport device.

9. A method for reducing patterning device slip during movement of a patterning device stage, comprising:
supporting a patterning device with a support device;
concurrently holding the patterning device to the support device with a holding device;
moving the support device using a first moving device; and
applying a force to the patterning device using a magnetostrictive actuator concurrently with moving the support device using the moving device, wherein applying the force to the patterning device using the magnetostrictive actuator comprises creating a magnetic field to increase a length of a push rod in a direction substantially in a plane of the patterning device, the push rod comprising a magnetostrictive material, and wherein the push rod releasably couples with the patterning device.

10. The method of claim 9 further comprising controlling the moving device and the magnetostrictive actuator with a common signal.

11. The method of claim 9 further comprising, before moving the support device using the first moving device and before concurrently applying the force to the patterning device using the magnetostrictive actuator:
biasing the push rod against the patterning device before creating the magnetic field to increase the length of the push rod;
clamping a portion of the push rod to the support device after increasing the length of the push rod; and
removing the magnetic field to reduce the length of the push rod while the portion of the push rod is clamped to the support device;
wherein a gap is created between a distal end of the push rod and the patterning device.

* * * * *

UNITED STATES PATENT AND TRADEMARK OFFICE
CERTIFICATE OF CORRECTION

PATENT NO. : 8,885,149 B2
APPLICATION NO. : 13/281718
DATED : November 11, 2014
INVENTOR(S) : Darya Amin-Shahidi It is certified that error appears in the above-identified patent and that said Letters Patent is hereby corrected as shown below:

In the Claims
In column 15, line 25, claim 5, please delete "first".
In column 16, line 17, claim 9, please delete "first".
In column 16, line 31, claim 11, please delete "first".

Signed and Sealed this
Twelfth Day of May, 2015

Michelle K. Lee
*Director of the United States Patent and Trademark Office*